US012564103B2

(12) United States Patent
Ahn

(10) Patent No.: US 12,564,103 B2
(45) Date of Patent: Feb. 24, 2026

(54) SEMICONDUCTOR PACKAGE

(71) Applicant: Samsung Electronics Co., Ltd.,
Suwon-si (KR)

(72) Inventor: Seokgeun Ahn, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 456 days.

(21) Appl. No.: 18/170,633

(22) Filed: Feb. 17, 2023

(65) Prior Publication Data

US 2023/0317678 A1 Oct. 5, 2023

(30) Foreign Application Priority Data

Apr. 1, 2022 (KR) ......................... 10-2022-0040954

(51) Int. Cl.
H01L 25/065 (2023.01)
H01L 23/00 (2006.01)
H01L 23/31 (2006.01)

(52) U.S. Cl.
CPC ...... H01L 25/0652 (2013.01); H01L 23/3128
(2013.01); H01L 24/48 (2013.01); *H01L*
*2224/48091* (2013.01); *H01L 2224/48227*
(2013.01); *H01L 2225/0651* (2013.01)

(58) Field of Classification Search
None
See application file for complete search history.

(56) References Cited

U.S. PATENT DOCUMENTS

| | | | |
|---|---|---|---|
| 8,643,164 B2 | 2/2014 | Kaufmann et al. | |
| 8,847,377 B2 | 9/2014 | Kim et al. | |
| 8,895,440 B2 | 11/2014 | Choi et al. | |
| 9,196,601 B2 | 11/2015 | Park et al. | |
| 10,818,640 B1 | 10/2020 | Yu et al. | |

(Continued)

FOREIGN PATENT DOCUMENTS

| | | |
|---|---|---|
| JP | 2014229780 A | 12/2014 |
| KR | 101096454 B1 | 12/2011 |
| KR | 10-2017-0051474 A | 5/2017 |

*Primary Examiner* — Cory W Eskridge
(74) *Attorney, Agent, or Firm* — Wolf, Greenfield &
Sacks, P.C.

(57) ABSTRACT

A semiconductor package, includes: a first semiconductor
chip including first connection pads on the first front surface,
and through electrodes extending perpendicularly to the first
rear surface and electrically connected to at least a portion
of the first connection pads; a second semiconductor chip
including second connection pads on the second front sur-
face, and on the first rear surface so that the second rear
surface faces the first semiconductor chip; a dielectric layer
on the second semiconductor chip; first conductive struc-
tures in the dielectric layer, and connecting the through
electrodes of a first group and the second connection pads;
second conductive structures in the dielectric layer, and
having first and second ends, the first ends connected to the
through electrodes of a second group and at least a portion
of the second ends thereof being exposed from the dielectric
layer; at least one third semiconductor chip including third
connection pads on the third front surface, and on the
dielectric layer so that the third rear surface faces the second
semiconductor chip; conductive wires connecting the sec-
ond conductive structures and the third connection pads.

20 Claims, 14 Drawing Sheets

(56)     References Cited

U.S. PATENT DOCUMENTS

| | | | |
|---|---|---|---|
| 2014/0001651 A1 | 1/2014 | Nickerson et al. | |
| 2014/0175673 A1* | 6/2014 | Kim | H01L 24/06 |
| | | | 257/777 |
| 2015/0137346 A1* | 5/2015 | Kwon | H01L 21/565 |
| | | | 438/109 |
| 2016/0079220 A1 | 3/2016 | Lin et al. | |
| 2017/0243855 A1* | 8/2017 | Kim | H01L 25/0657 |
| 2021/0098419 A1 | 4/2021 | Saleh et al. | |
| 2021/0242186 A1 | 8/2021 | Kim et al. | |

* cited by examiner a1-a1' a2-a2' a1-a1' a2-a2' a1-a1' a2-a2' a1-a1'

SEMICONDUCTOR PACKAGE

CROSS-REFERENCE TO RELATED APPLICATION

This application claims the priority and benefit of Korean Patent Application No. 10-2022-0040954, filed on Apr. 1, 2022, with the Korean Intellectual Property Office, the disclosure of which is incorporated herein by reference.

BACKGROUND

1. Field

The present inventive concept relates to a semiconductor package.

2. Description of Related Art

As demand for high performance, thinning, and miniaturization of electronic products increases, packaging technologies for integrating a plurality of semiconductor chips into a single package are being developed. For example, when a plurality of semiconductor chips are bonded using thermal compression bonding, yield may decrease due to an increase in process difficulty, and/or electrical properties may be deteriorated resulting from bonding between different materials (e.g., copper (Cu)-tin (Sn)).

SUMMARY

An aspect of the present inventive concept is to provide a semiconductor package having improved electrical characteristics and yield.

According to an aspect of the present inventive concept, a semiconductor package, includes: a first semiconductor chip having a first front surface and a first rear surface opposing each other, and including first connection pads on the first front surface, and through electrodes extending perpendicularly to the first rear surface and electrically connected to at least a portion of the first connection pads; a second semiconductor chip having a second front surface and a second rear surface opposing each other, including second connection pads on the second front surface, and on the first rear surface so that the second rear surface faces the first semiconductor chip; a dielectric layer on the second semiconductor chip on the first rear surface; first conductive structures in the dielectric layer, and connecting the through electrodes of a first group and the second connection pads; second conductive structures in the dielectric layer, and having first and second ends, the first ends connected to the through electrodes of a second group and at least a portion of the second ends thereof being exposed from the dielectric layer; at least one third semiconductor chip having a third front surface and a third rear surface opposing each other, including third connection pads on the third front surface and on the dielectric layer so that the third rear surface faces the second semiconductor chip; conductive wires connecting the second conductive structures and the third connection pads; an encapsulation layer on the dielectric layer and the at least one third semiconductor chip on the first rear surface; and connection bumps on the first front surface, and electrically connected to the first connection pads.

According to an aspect of the present inventive concept, a semiconductor package includes: a first semiconductor chip having a first front surface and a first rear surface opposing each other, and including first connection pads on the first front surface, and through electrodes arranged in a first direction parallel to the first rear surface, and electrically connected to at least a portion of the first connection pads; at least one pair of second semiconductor chips spaced apart from each other in a second direction intersecting the first direction on the first rear surface of the first semiconductor chip, and including second connection pads; first and second conductive structures electrically connected to the through electrodes between the at least one pair of second semiconductor chips; a dielectric layer on the at least a portion of each of the at least a portion of second semiconductor chips, the first conductive structures, and the second conductive structures; and at least one pair of third semiconductor chips spaced apart from each other in the second direction on the dielectric layer, and including third connection pads; wherein the first conductive structures extend in the dielectric layer to connect the through electrodes of a first group and the second connection pads, and the second conductive structures are exposed from the dielectric layer to connect the through electrodes of a second group and a conductive wire connected to the third connection pads.

According to an aspect of the present inventive concept, a semiconductor package, includes: a first semiconductor chip having a first front surface and a first rear surface opposing each other, and including first connection pads on the first front surface, and through electrodes extending perpendicularly to the first rear surface and electrically connected to at least a portion of the first connection pads; a second semiconductor chip having a second front surface and a second rear surface opposing each other, including second connection pads on the second front surface, and on the first rear surface so that the second rear surface faces the first semiconductor chip; conductive structures including a pattern portion extending in parallel to the first rear surface on the second semiconductor chip, and a via portion extending from the pattern portion and connected to the second connection pads or the through electrodes; a dielectric layer on the first rear surface of the first semiconductor chip, and on the second semiconductor chip and the conductive structures; and an encapsulation layer on the first rear surface of the first semiconductor chip, and on a side surface of the dielectric layer.

BRIEF DESCRIPTION OF THE DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
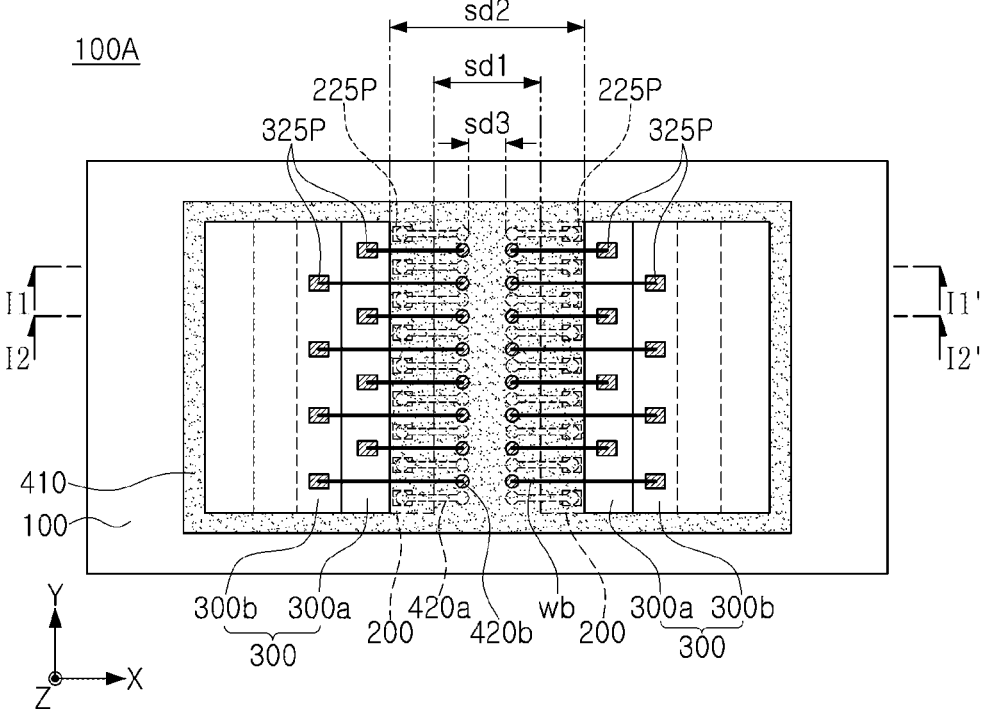
FIG. 1 is a plan view illustrating a semiconductor package according to an example embodiment of the present inventive concept.
Figure 2A:
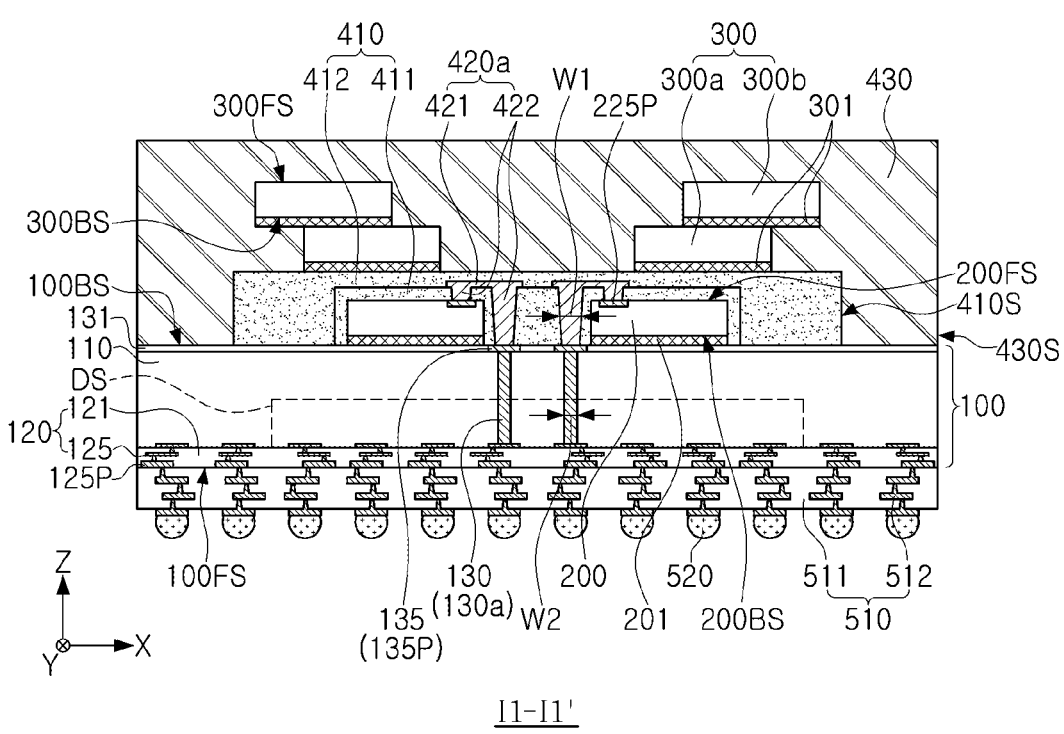
FIG. 2A is a cross-sectional view illustrating a cross-sectional view illustrating a cutting surface taken along line I1-I1' of FIG. 1.
Figure 2B:
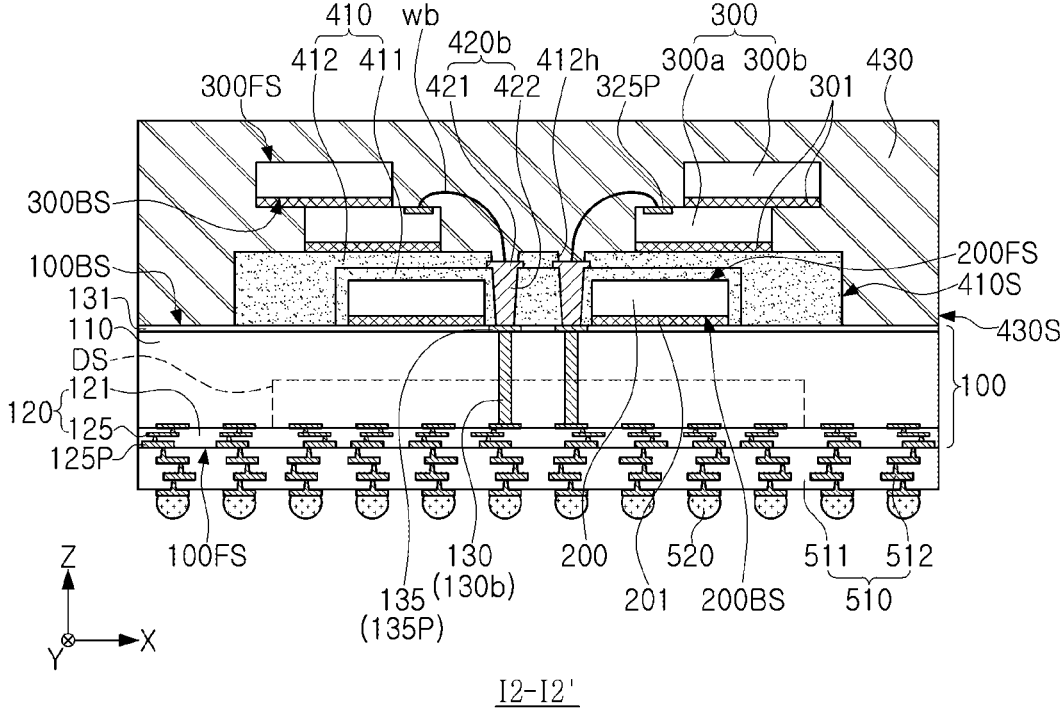
FIG. 2B is a cross-sectional view illustrating a cutting surface taken along line I2-I2' of FIG. 1.

FIG. 1 is a plan view illustrating a semiconductor package 100A according to an example embodiment of the present inventive concept, FIG. 2A is a cross-sectional view illustrating a cutting surface taken along line I1-I1' of FIG. 1, and FIG. 2B is a cross-sectional view illustrating a cutting surface taken along line I2-I2' of FIG. 1. FIG. 1 illustrates components of the semiconductor package 100A while omitting the encapsulation layer 430 of FIGS. 2A and 2B.

Referring to FIGS. 1 to 2B, the semiconductor package 100A according to an example embodiment may include a first semiconductor chip 100, a second semiconductor chip 200, a dielectric layer 410, and conductive structures 420a and 420b. According to an example embodiment, the semiconductor package 100A may further include a third semiconductor chip 300 and/or an encapsulation layer 430. The second semiconductor chip 200 and the third semiconductor chip 300 may be face-up on a first rear surface 100BS of the first semiconductor chip 100. The second semiconductor chip 200 may be electrically connected to the through electrodes 130 of the first semiconductor chip 100 through first conductive structures 420a, and the third semiconductor chip 300 may be electrically connected to the through electrodes 130 of the first semiconductor chip 100 through second conductive structures 420b and a conductive wire wb.

In the present inventive concept, the second semiconductor chip 200 may be attached to the first rear surface 100BS of the first semiconductor chip 100 using a first adhesive film (e.g., Die Attach Film) 201, and the second semiconductor chip 200 and the first semiconductor chip 100 may be electrically connected to each other through first conductive structures 420a. Therefore, the first semiconductor chip 100 and the second semiconductor chip 200 may be bonded without a thermocompression process, and an electrical connection path between the first semiconductor chip 100 and the second semiconductor chip 200 may be formed without bonding between different materials, so that yield and electrical characteristics of the semiconductor package 100A may be improved. According to an example embodiment, the third semiconductor chip 300 may be further attached thereto using a second adhesive film 301, and the third semiconductor chip 300 and the first semiconductor chip 100 may be electrically connected to each other through the conductive wire wb and the second conductive structures 420b, so that the yield and electrical characteristics of the semiconductor package 100A may be improved.

Hereinafter, components of the semiconductor package 100A will be described in detail with reference to FIGS. 1 to 2B.

The first semiconductor chip 100 may have a first front surface 100FS and a first rear surface 100BS opposing each other, and may include a substrate 110, an interconnection layer 120, and through electrodes 130. The substrate 110 may include a semiconductor element such as silicon or germanium (Ge), or a compound semiconductor such as silicon carbide (SiC), gallium arsenide (GaAs), indium arsenide (InAs), or indium phosphide (InP). The substrate 110 may have an active surface with an active region doped with impurities (e.g., a surface opposing the interconnection layer 120) and an inactive surface opposite thereto. The substrate 110 may include an integrated circuit DS formed on the active surface. The integrated circuit DS may include an active element such as a transistor and/or a passive element such as a capacitor, a resistor, or an inductor. For example, the integrated circuit DS may be a logic IC including logic gates such as AND, OR, NOT, and the like, and the first semiconductor chip 100 may be a logic chip such as a central processor (CPU), a graphics processor (GPU), a field programmable gate array (FPGA), a digital signal processor (DSP), a cryptographic processor, a microprocessor, a microcontroller, an analog-to-digital converter, an application-specific IC (ASIC), or an application processor (AP).

The interconnection layer 120 may be on the active surface of the substrate 110, and may include an interlayer insulating layer 121 and an interconnection structure 125. The interlayer insulating film 121 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), and Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. The interlayer insulating layer 121 may be formed using a chemical vapor deposition (CVD) process, a flowable-CVD process, or a spin coating process. The interconnection structure 125 may be formed in a multilayer structure including an interconnection pattern formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof and vias. The interconnection structure 125 may be electrically connected to the integrated circuit DS, and first connection pads 125P exposed to the first front surface 100FS may be positioned at a lower end of the interconnection structure 125.

The through electrodes 130 may extend vertically between the first front surface 100FS and the first rear surface 100BS and may electrically connect the interconnection structure 125 and the back interconnection structure 135. For example, the through electrodes 130 may extend perpendicularly to the first rear surface 100BS and may electrically connect at least a portion of first connection pads 125P and back pads 135P. The through electrodes 130 may include, for example, tungsten (W), titanium (Ti), aluminum (Al), or copper (Cu), and may be formed by a plating process, a PVD process, or a CVD process. The through electrodes 130 may be surrounded by a side barrier film including titanium (Ti), titanium nitride (TiN), tantalum (Ta), or tantalum nitride (TaN). A side insulating film such as silicon oxide, silicon nitride, silicon oxynitride, or the like may be formed between the side barrier film and the substrate 110. The back interconnection structure 135 may be covered by the back insulating layer 131 including silicon oxide, silicon nitride, silicon oxynitride, or the like. Although the back interconnection structure 135 is illustrated as a single-layer structure including only the back pads 135P (refer to FIGS. 2A and 2B), according to an example embodiment, the back interconnection structure 135 may be formed in a multilayer structure like the interconnection structure 125.

The second semiconductor chip 200 and the third semiconductor chip 300 may be face-up using first and second adhesive films 201 and 301, respectively. Similar to the first semiconductor chip 100, the second semiconductor chip 200 and the third semiconductor chip 300 may include a substrate, an integrated circuit, and the like. The second semiconductor chip 200 and the third semiconductor chip 300 may be memory chips including a memory circuit such as DRAM, SRAM, PRAM, MRAM, FeRAM, or RRAM. The second semiconductor chip 200 and the third semiconductor chip 300 may be configured as chips for performing different functions. For example, the second semiconductor chip 200 may be a cache memory, and the third semiconductor chip 300 may be a main memory. Each of the second semiconductor chip 200 and the third semiconductor chip 300 may be provided as a plurality of semiconductor chips.

In the present inventive concept, by attaching the second semiconductor chip 200 and the third semiconductor chip 300 to be face-up, and electrically connecting the second semiconductor chip 200 and the third semiconductor chip 300 to the first semiconductor chip 100 through the first conductive structures 420a and the second conductive structures 420b, respectively, the second semiconductor chip 200 and the third semiconductor chip 300 may be stacked without a thermocompression process and an electrical connection path may be formed without bonding between different materials.

For example, the second semiconductor chip 200 may have a second front surface 200FS and a second rear surface 200BS opposing each other and include second connection pads 225P on the second front surface 200FS. A first adhesive film 201 may be on the second rear surface 200BS of the second semiconductor chip 200, and the second semiconductor chip 200 may be on the first rear surface 100BS so that the second rear surface 200BS faces the first semiconductor chip 100. The second semiconductor chip 200 may be in the dielectric layer 410 and may be electrically connected to the first semiconductor chip 100 by the first conductive structure 420a connecting through electrodes 130a of a first group and the second connection pads 225P.

For example, the third semiconductor chip 300 may have a third front surface 300FS and a third rear surface 300BS opposing each other and may include third connection pads 325P on the third front surface 300FS. A second adhesive film 301 may be on the third rear surface 300BS of the third semiconductor chip 300, and the third semiconductor chip 300 may be on the dielectric layer 410 so that the third rear surface 300BS faces the second semiconductor chip 200. In order to improve adhesion between the second adhesive film 301 and the dielectric layer 410, the third semiconductor chip 300 may be positioned so as to not overlap the first and second conductive structures 420a and 420b in a vertical direction (Z direction). That is, in an upper region of the first and second conductive structures 420a and 420b, an upper surface of the dielectric layer 410 has a low flatness, so that the adhesion of the second adhesive film 301 may be reduced, and the third semiconductor chip 300 may be outside the upper region. The other ends of the second conductive structures 420b exposed or free from the dielectric layer 410 may be connected to third connection pads 325P through conductive wires wb. According to an example embodiment, the third semiconductor chip 300 may be provided as a third lower semiconductor chip 300a and a third upper semiconductor chip 300a. The third lower semiconductor chip 300a and the third upper semiconductor chip 300a may be electrically connected to through electrodes 130b of a second group through the conductive wire wb and the second conductive structures 420b, respectively.

The dielectric layer 410 may be on the first rear surface 100B S of the first semiconductor chip 100, and may be on or cover the second semiconductor chip 200 and the first and second conductive structures 420a and 420b. The dielectric layer 410 may have openings 412h exposing at least a portion of the second conductive structures 420b (see FIG. 2B). Conductive wires wb may be connected to the second conductive structures 420b through the openings 412h. The dielectric layer 410 may be formed so as not to be exposed to the surface of the encapsulation layer 430. For example, the dielectric layer 410 may have a width narrower than the width of the first semiconductor chip 100 in a horizontal direction (X or Y direction). The dielectric layer 410 may include a dielectric material such as silicon oxide, silicon nitride, or silicon oxynitride, or a photosensitive resin such as a photoimageable dielectric (PID). In the present inventive concept, by patterning the dielectric layer 410 so that a side surface 410S of the dielectric layer 410 is spaced apart from an edge of the first semiconductor chip 100, interfacial delamination between the dielectric layer 410 and the encapsulation layer 430 may be reduced or prevented. The dielectric layer 410 may include a first dielectric layer on or covering the second front surface 200F and a side surface of the second semiconductor chip 200, and a second dielectric layer 412 on or surrounding the first dielectric layer 411. Depending on the process, a boundary between the first dielectric layer 411 and the second dielectric layer 412 may not be clear.

The first conductive structures 420a and the second conductive structures 420b may include, for example, copper (Cu), aluminum (Al), silver (Ag), tin (Sn), gold (Au), nickel (Ni), lead (Pb), titanium (Ti), or a metal material including an alloy thereof. In the present inventive concept, by forming the first conductive structures 420a and the second conductive structures 420b in the dielectric layer 410 patterned by a photolithography process, an electrical path formed of substantially the same metal material may be formed, without an interface between different materials (e.g., copper (Cu)-tin (Sn)). The first conductive structures 420a and the second conductive structures 420b may include a pattern portion 421 extending in parallel in the dielectric layer 410 and a via portion 422 extending perpendicularly from the pattern portion 421, and electrically connected to the second connection pads 225P or the through electrodes 130, respectively. The pattern portion 421 and the via portion 422 may be integrated so that boundaries may not be distinguished. For example, the first conductive structures 420a may include a pattern portion 421 extending in parallel between the first dielectric layer 411 and the second dielectric layer 412, and via portions 422 extending perpendicularly from the pattern portion 421 to penetrate through the first dielectric layer 411 and electrically connected to the second connection pads 225P and the first through electrodes 130a, respectively. The second conductive structures 420b may include a pattern portion 421 between the first dielectric layer 411 and the second dielectric layer 412 and in which at least a portion thereof is exposed through an opening 412h of the second dielectric layer 412, and via portions 422 extending perpendicularly from the pattern portion 421 to penetrate through the first dielectric layer 411 and electrically connected to the second through electrodes 130b, respectively. The pattern portion 421 may include a pad portion contacting the via portion 422 and a line portion extending from one side of the pad portion. The line portion may have a line width, smaller than the width of the pad portion. The via portion 422 may have a first width W1 greater than a second width W2 of the through electrodes 130. For example, the first width W1 may be in a range of about 1 μm to about 100 μm, of about 10 μm to about 100 μm, of about 10 μm to about 50 μm, or of about 10 μm to about 25 μm. The second width W2 may be in a range of about 1 μm to about 10 μm.

For example, the semiconductor package 100A may include a plurality of second semiconductor chips 200 and a plurality of third semiconductor chips 300. In this case, the plurality of second semiconductor chips 200 and the plurality of third semiconductor chips 300 may be on both sides of the first conductive structures 420a and the second conductive structures 420b.

For example, on a X-Y plane, the semiconductor package 100A may include a first semiconductor chip 100 arranged in a first direction (e.g., Y direction), parallel to the first rear surface 100BS, and including through electrodes 130 electrically connected to at least a portion of first connection pads 125P; at least one pair of second semiconductor chips 200 spaced apart in a second direction (e.g., X direction) crossing the first direction (e.g., Y direction) on the first rear surface 100BS of the first semiconductor chip 100, and including second connection pads 225P; and at least one pair of third semiconductor chips 300 spaced apart in a second direction (e.g., X direction) on the dielectric layer 410, and including third connection pads 325P.

In this case, the first conductive structures 420a and the second conductive structures 420b may be electrically connected to the through electrodes 130 between at least one pair of second semiconductor chips 200. The first conductive structure 420a may include a pattern portion 421 extending in a second direction (e.g., X direction) on the second semiconductor chip 200, and via portions extending perpendicularly to the first rear surface 100BS (Z direction) and electrically connected to the second connection pads 225P and the first through electrodes 130a, respectively. The second conductive structures 420b may include a pattern portion 421 exposed through an opening 412h and a via portion 422 electrically connected to the second through electrodes 130b.

In addition, at least one pair of third semiconductor chips 400 may be positioned so as to not overlap the first conductive structures 420a and the second conductive structures 420b in a direction (Z direction) perpendicular to the first rear surface 100BS. Accordingly, a first separation distance sd1 between the at least one pair of second semiconductor chips 200 may be smaller than a second separation distance sd2 between the at least one pair of third semiconductor chips 300. A third separation distance sd3 between the first conductive structures 420a and the second conductive structures 420b, spaced apart in the second direction (e.g., X direction) between the at least one pair of second semiconductor chips 200 may be smaller than the first separation distance sd1 between the at least one pair of second semiconductor chips 200. Here, the first separation distance sd1 may be in a range of about 10 μm to about 200 μm, about 25 μm to about 100 μm, or about 50 μm to about 100 μm, but an example embodiment thereof is not limited thereto.

In addition, the dielectric layer 410 may be formed on or to cover at least a portion of each of the at least one pair of the second semiconductor chips 200, the first conductive structures 420a, and the second conductive structures 420b. A side surface of the dielectric layer 410 may be spaced apart from a side surface or an edge of the first semiconductor chip 100 and may be surrounded by an encapsulation layer 430. Accordingly, the dielectric layer 410 is not exposed to a surface of the encapsulation layer 430, and interfacial delamination between the dielectric layer 410 and the encapsulation layer 430 can be reduced or prevented.

The encapsulation layer 430 may be on the first rear surface 100BS of the first semiconductor chip 100 and may encapsulate the dielectric layer 410 and the third semiconductor chip 300. Since the encapsulation layer 430 is on or covers a side surface 410S of the dielectric layer 410, a side surface 430S of the encapsulation layer 430 may be spaced apart from the side surface 410S of the dielectric layer 410. The encapsulation layer 430 may include a thermosetting resin such as an epoxy resin, a thermoplastic resin such as polyimide, or a prepreg including an inorganic filler or/and a glass fiber, Ajinomoto Build-up Film (ABF), FR-4, Bis-maleimide Triazine (BT), an Epoxy Molding Compound (EMC), and the like. According to an example embodiment, the encapsulation layer 430 may include a material that is different from the material of the dielectric layer 410. For example, the dielectric layer 410 may include a photosensitive resin, and the encapsulation layer 430 may include a non-photosensitive resin.

The redistribution structure 510 may be between the first semiconductor chip 100 and connection bumps 520 and may include an insulating layer 511 and a redistribution layer 512. The insulating layer 511 may be disposed on the first front surface 100FS of the first semiconductor chip 100 and may include an insulating resin. The insulating resin may include a thermosetting insulating resin such as an epoxy resin, a thermoplastic insulating resin such as a polyimide, or a resin impregnated with inorganic fillers and/or glass fibers in these resins, for example, a photosensitive resin such as prepreg, ABF, FR-4, BT, or PID. The redistribution layer 512 may electrically connect the first connection pads 125P and the connection bumps 520 in the insulating layer 511. The redistribution layer 512 may be formed in a multilayer structure including a pattern formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof and vias. The connection bumps 520 may be on the first front surface 100FS and may be electrically connected to the first connection pads 125P through the redistribution layer 512. The connection bumps 520 may have a spherical or ball shape made of a low-melting-point metal, for example, tin (Sn), indium (In), bismuth (Bi), antimony (Sb), copper (Cu), silver (Ag), zinc (Zn), lead (Pb), an alloy containing thereof (eg, Sn—Ag—Cu), or the like.

Figure 3:
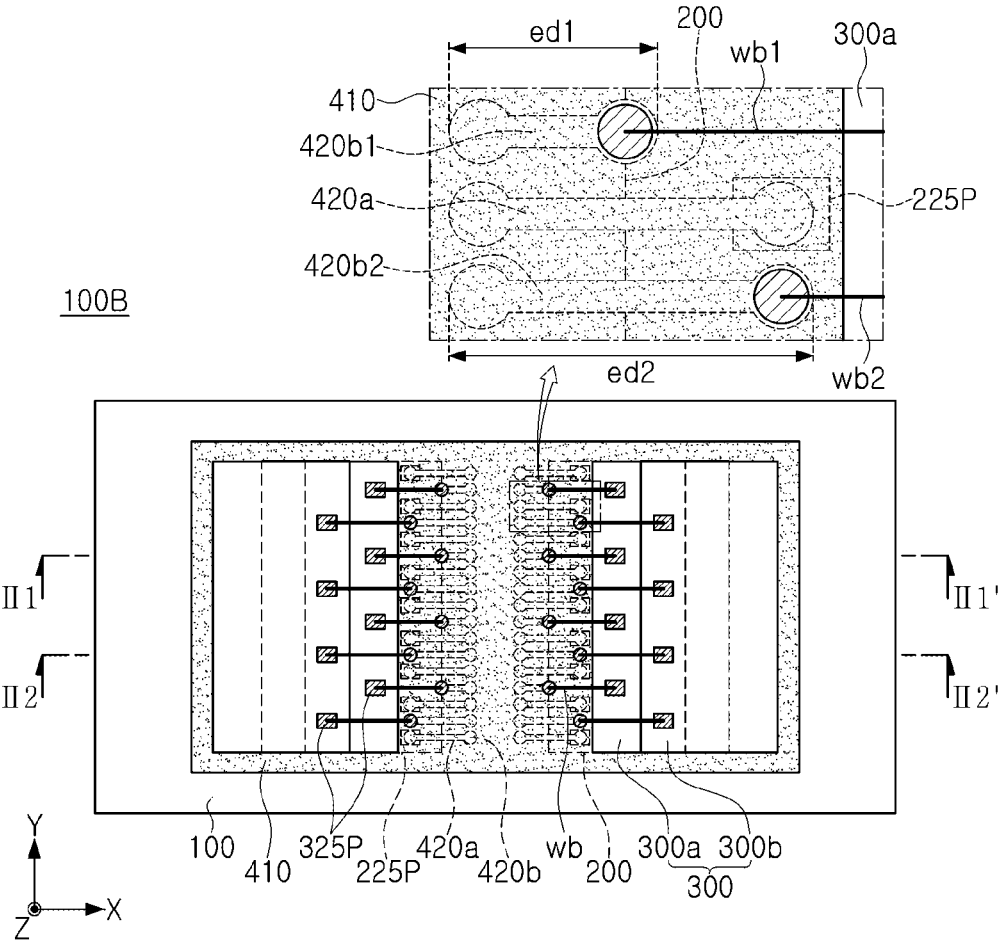
FIG. 3 is a plan view illustrating a semiconductor package according to an example embodiment of the present inventive concept.
Figure 4A:
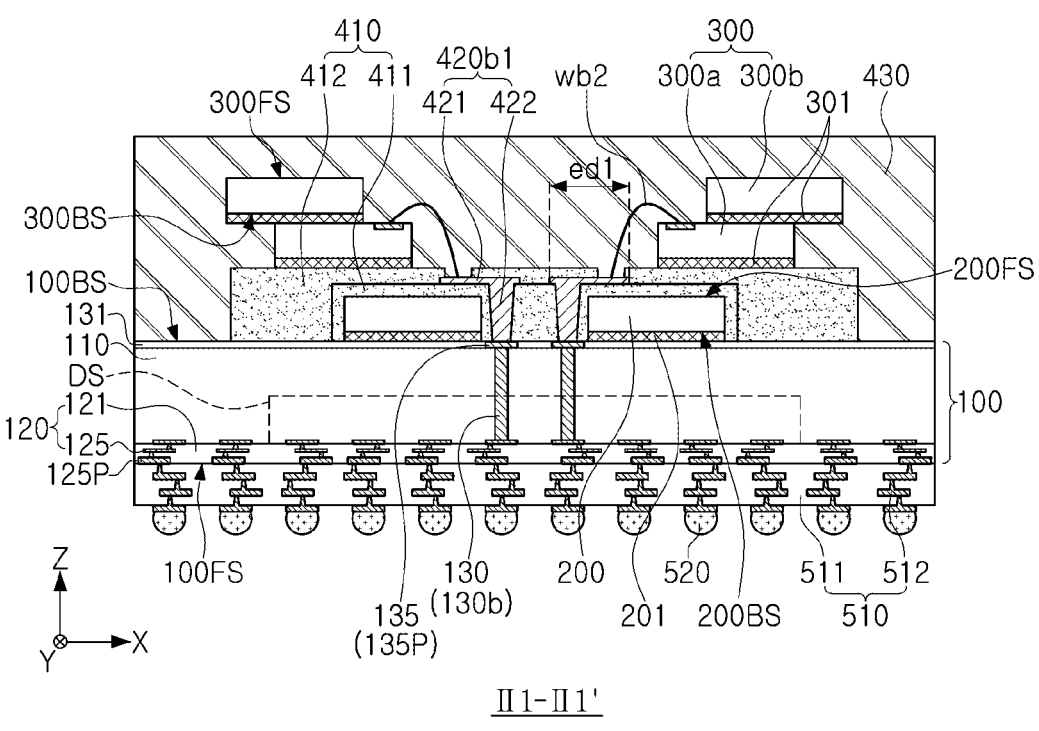
FIG. 4A is a cross-sectional view illustrating a cutting surface taken along line II1-III' of FIG. 3.
Figure 4B:
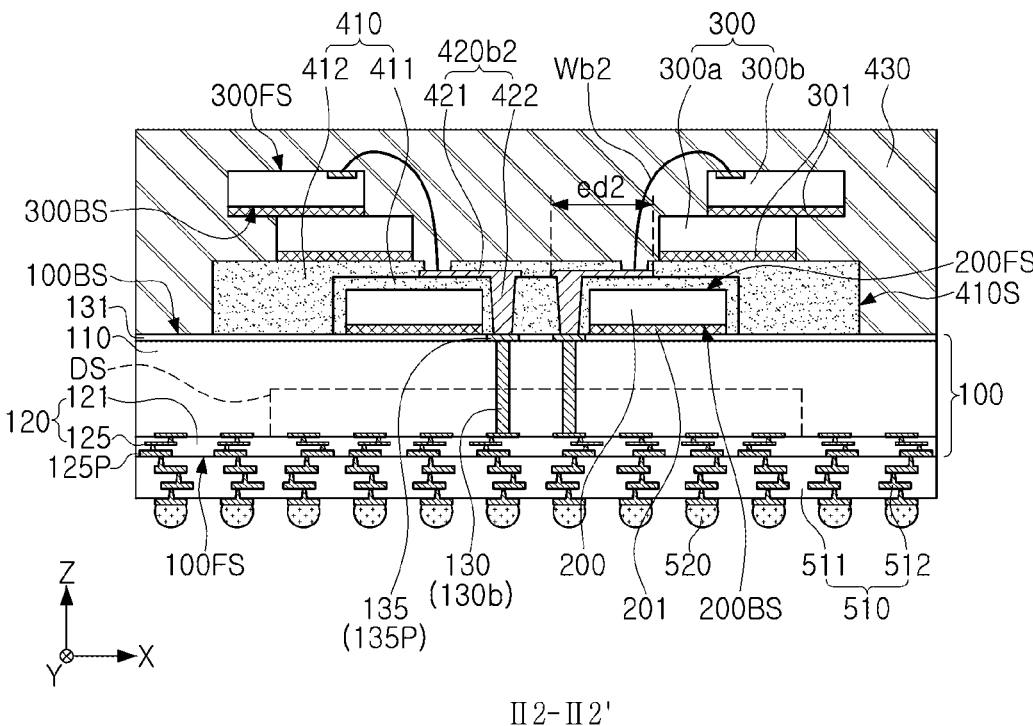
FIG. 4B is a cross-sectional view illustrating a cutting surface taken along line II2-II2' of FIG. 3.

FIG. 3 is a plan view illustrating a semiconductor package 100B according to an example embodiment of the present inventive concept, FIG. 4A is a cross-sectional view illustrating a cutting surface taken along line II1-III1' of FIG. 3, and FIG. 4B is a cross-sectional view illustrating a cutting surface taken along line II2-II2' of FIG. 3. FIG. 3 illustrates remaining components while omitting some components, as in FIG. 1.

Referring to FIGS. 3 to 4B, the semiconductor package 100B may have the same or similar characteristics as those described with reference to FIGS. 1 to 2B, except that second conductive structures 420b horizontally extend to be adjacent to the third semiconductor chip 300. In the present example embodiment, the second conductive structures 420b may include a pattern portion 421 extending in parallel on the second semiconductor chip 200. Accordingly, compared to the example embodiment illustrated in FIG. 1, a length of a conductive wire wb connecting the second conductive structures 420b and third connection pads 325P may be shortened.

According to an example embodiment, the third semiconductor chip 300 may include a third lower semiconductor chip 300a and a third upper semiconductor chip 300a. The third lower semiconductor chip 300a may be connected to second conductive structures 420b1 of a first group through a first conductive wire wb1. The third upper semiconductor chip 300a may be connected to second conductive structure 420b2 of a second group through a second conductive wire wb2. In this case, the second conductive structures 420b1 of the first group and the second conductive structures 420b2 of the second group may have different lengths. For example, a first extension length ed1 of the second conductive structures 420b1 of the first group may be shorter than a second extension length ed2 of the second conductive structures 420b2 of the second group. However, the extension length of the second conductive structures 420b is not limited to the shape illustrated in the drawings. For example, the first extension length ed1 may be longer than the second extension length ed2, and the first extension lengths ed1 of each of the second conductive structures 420b1 of the first group and/or the second extension lengths ed2 of each of the second conductive structures 420b2 of the second group may be different from each other.

Figure 5:
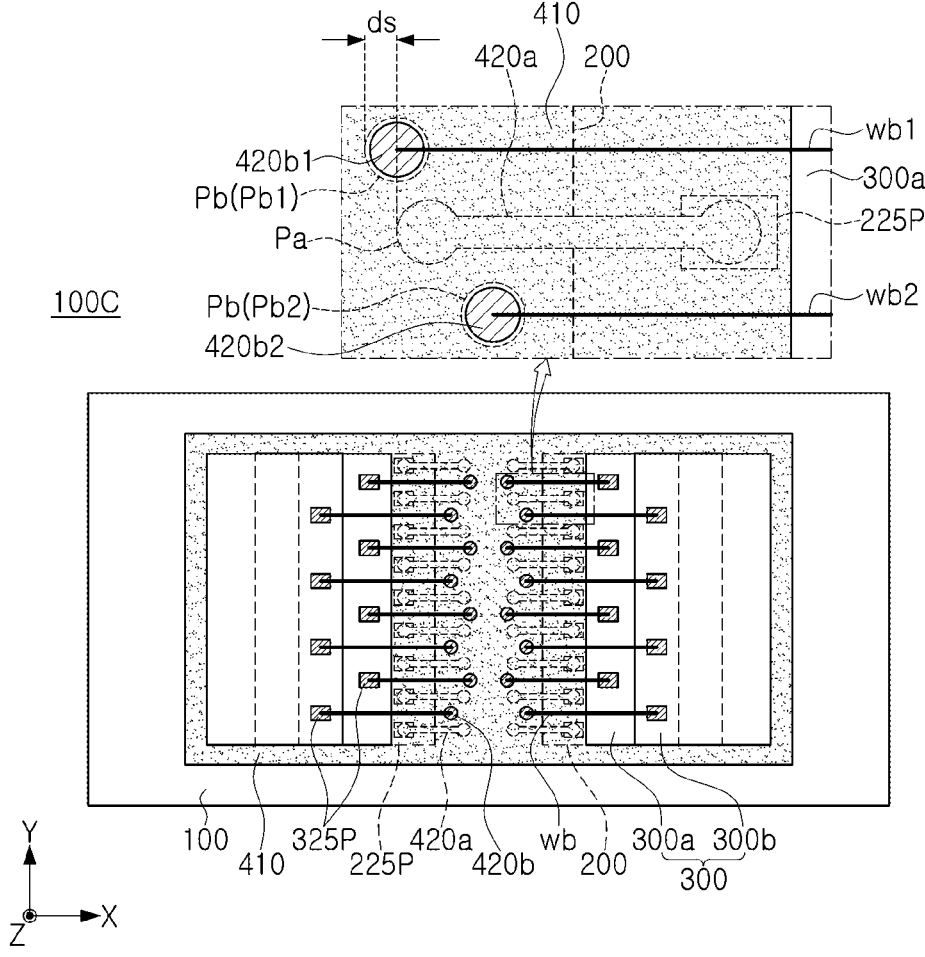
FIG. 5 is a plan view illustrating a semiconductor package according to an example embodiment of the present inventive concept.

FIG. 5 is a plan view illustrating a semiconductor package 100C according to an example embodiment of the present inventive concept. FIG. 5 illustrates remaining components while omitting some components, as in FIG. 1.

Referring to FIG. 5, the semiconductor package 100C according to an example embodiment may have the same or similar characteristics as described with reference to FIGS. 1 to 4B, except that the second conductive structures 420b are positioned with the first conductive structures 420a alternating one after the other. In the present example embodiment, a pad portion Pb of the second conductive structures 420b may be positioned alternating from a pad portion Pa of the first conductive structures 420a in a first direction (e.g., Y direction). Accordingly, a short circuit between the first conductive structures 420a and the second conductive structures 420b may be reduced or prevented, and a degree of integration may be improved. Here, the pad portion Pb of the second conductive structures 420b may overlap the second through electrodes (130b' in FIG. 2B), and the pad portion Pa of the first conductive structures 420a may overlap with the first through electrodes ('130a' in FIG. 2A). The pad portion Pb of the second conductive structures 420b may be shifted to have a predetermined distance ds with from the pad portion Pa of the first conductive structures 420a in a second direction (e.g., X direction). For example, in the second direction (e.g., X-direction), the distance ds between the pad portion Pb of the second conductive structures 420b and the pad portion Pa of the first conductive structures 420a may range from about 1 μm to about 25 μm, from about 1 μm to about 10 μm.

According to an example embodiment, the third semiconductor chip 300 may include a third lower semiconductor chip 300a and a third upper semiconductor chip 300a. The third lower semiconductor chip 300a may be connected to the first pad portion Pb1 of the second conductive structures 420b1 of the first group through a first conductive wire wb1. The third upper semiconductor chip 300a may be connected to the second pad portion Pb2 of the second conductive structures 420b2 of the second group through a second conductive wire wb2. In this case, the first pad portion Pb1 and the second pad portion Pb2 may be shifted in different directions. For example, the first pad portion Pb1 may be shifted away from the third semiconductor chip 300, and the second pad portion Pb2 may be shifted closer to the third semiconductor chip 300. However, the positions of the first pad portion Pb1 and the second pad portion Pb2 are not limited to those illustrated in the drawings.

Figure 6:
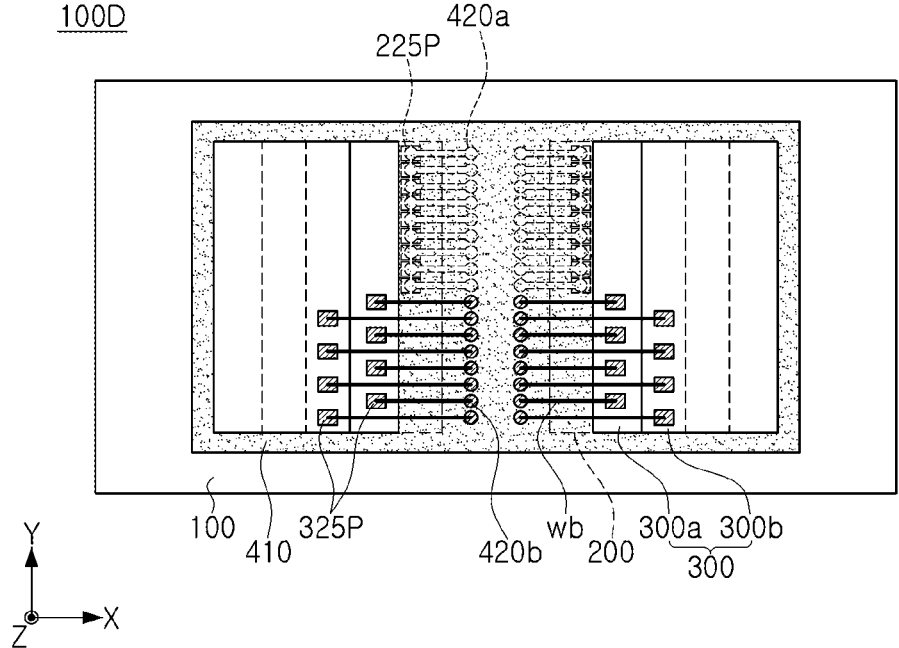
FIG. 6 is a plan view illustrating a semiconductor package according to an example embodiment of the present inventive concept.

FIG. 6 is a plan view illustrating a semiconductor package 100D according to an example embodiment of the present inventive concept. FIG. 6 illustrates remaining components while omitting some components, as in FIG. 1.

Referring to FIG. 6, the semiconductor package 100D according to an example embodiment may have the same or similar characteristics to that described with reference to FIGS. 1 to 5, except that positions of second connection pads 225P and third connection pads 325P are modified. In the present example embodiment, the second connection pads 225P may be concentrated in a partial region of the second semiconductor chip 200, and the third connection pads 325P may be concentrated in a partial region of the third semiconductor chip 300. Accordingly, the first conductive structures 420a and the second conductive structures 420b may be formed at a position corresponding to the second connection pads 225P and the third connection pads 325P, respectively. For example, on an X-Y plane, the first conductive structures 420a may be concentrated on one side of the dielectric layer 410, and the second conductive structures 420b may be concentrated on the other side of the dielectric layer 410. As described above, the position and physical relationship of the first conductive structures 420a and the second conductive structures 420b may be appropriately modified according to the design of the second semiconductor chip 200 and the third semiconductor chip 300.

FIGS. 7A to 14 are cross-sectional views illustrating a manufacturing process of the semiconductor package 100A of FIG. 1 according to a process sequence.

Figure 7A:
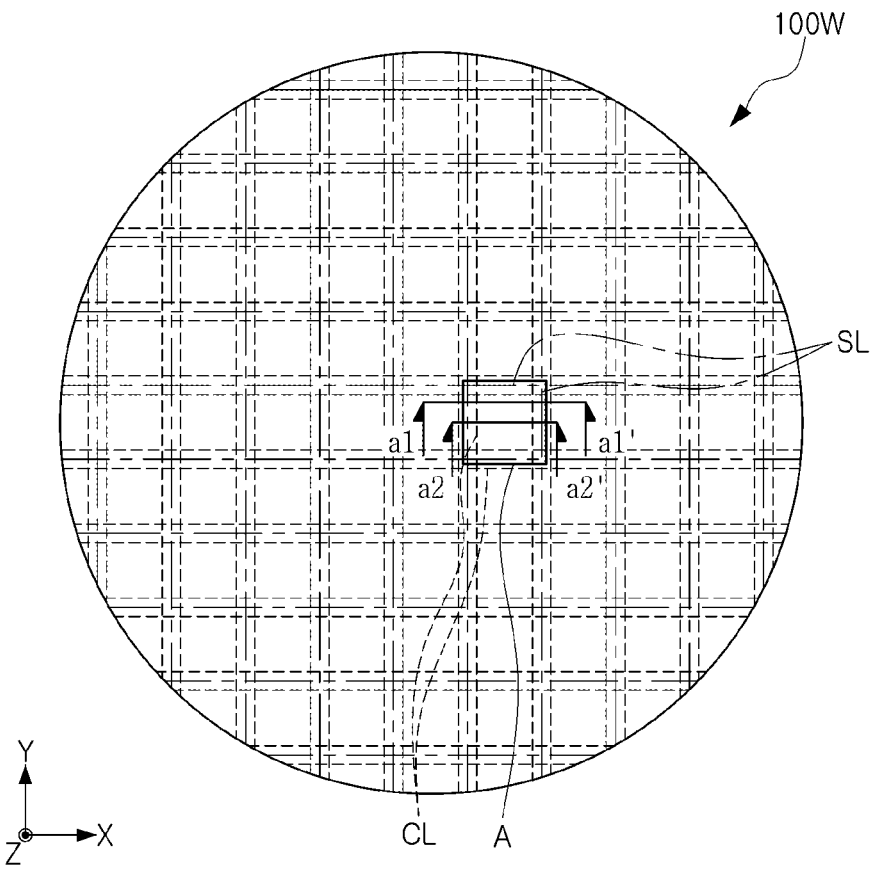
FIGS. 7A-7B, 8, 9A-9B, 10A-10B, 11A-11B, 12A-12B, 13, and 14 are cross-sectional views illustrating a manufacturing process of the semiconductor package of FIG. 1 according to a process sequence.
Figure 7B:
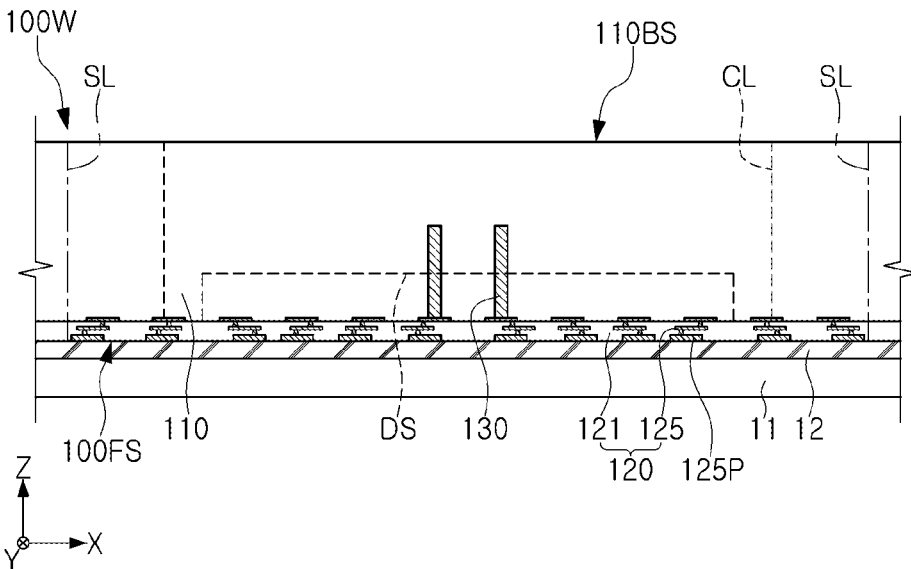

FIG. 7A is a plan view illustrating a semiconductor wafer 100W on which an interconnection layer 120 is formed, and FIG. 7B is a cross-sectional view illustrating a vertical cutting surface a1-a1 or a2-a2' in area 'A' of FIG. 7A.

Referring to FIGS. 7A and 7B, the semiconductor wafer 100W for a first semiconductor chip is prepared. The semiconductor wafer 100W may include a plurality of semiconductor chips separated by a scribed lane SL. An imaginary reference line CL limiting a formation region of the dielectric layer 410 in a subsequent process (refer to FIGS. 11A and 11B) may be positioned inside the scribe lane SL. The reference line CL may be spaced apart from the scribe lane SL by about 100 μm or more, but an example embodiment thereof is not limited thereto. The semiconductor wafer 100W may be temporarily bonded to a carrier substrate 11 using a bonding material layer 12. The bonding material layer 12 may be formed of an adhesive polymer material and may stably support the semiconductor wafer 100W during a subsequent process. The semiconductor wafer 100W may be in a state in which some components for the first semiconductor chips are formed. For example, the semiconductor wafer 100W may include an integrated circuit DS formed on an active surface of the substrate 110, an interconnection layer 120 formed under the integrated circuit DS, and through electrodes 130 penetrating through the integrated circuit DS and extending into the substrate 110. Directions of "up", "down", and the like, are based on that illustrated in FIG. 7B. Before a polishing process is applied, the substrate 110 may have a greater thickness than the through electrodes 130. The rear surface 110BS of the substrate 110 may be positioned at a level higher than upper ends of the through electrodes 130.

Figure 8:
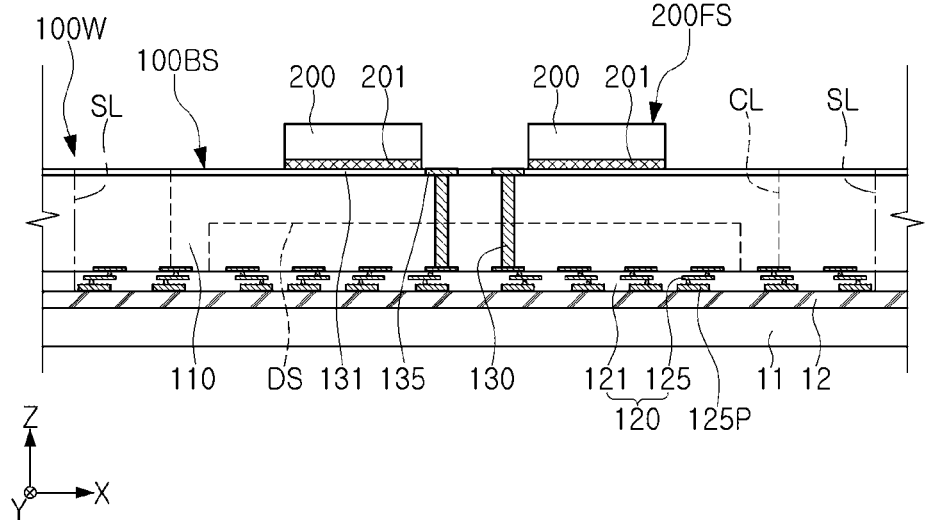

FIG. 8 illustrates a cross-section (a1-a1' or a2-a2') of the semiconductor wafer corresponding to FIG. 7B.

Referring to FIG. 8, a rear insulating layer 131 and a rear interconnection structure 135 may be formed on the rear surface 100BS of the semiconductor wafer 100W planarized by a polishing process. As a portion of the semiconductor wafer 100W is removed by the polishing process, upper ends of the through electrodes 130 may be exposed. As the polishing process, a grinding process such as a chemical mechanical polishing (CMP) process, an etch-back process, or a combination thereof may be used. For example, a grinding process may be performed to reduce the semiconductor wafer 100W to a predetermined thickness, and etch-back under appropriate conditions may be applied to sufficiently expose the through electrodes 130. The back insulating layer 131 may be formed using a chemical vapor deposition (CVD) process, a flowable-CVD process, or a spin coating process. The back interconnection structure 135 may be formed using an etching process, a plating process, or the like.

Thereafter, a second semiconductor chip 200 may be positioned on the rear surface 100BS of the semiconductor wafer 100W. The second semiconductor chip 200 may be attached to the semiconductor wafer 100W by a first adhesive film 201 so that the second front surface 200FS faces upwardly. According to an example embodiment, at least one pair of second semiconductor chips 200 may be positioned on both sides with the through electrodes 130 interposed therebetween.

Figure 9A:
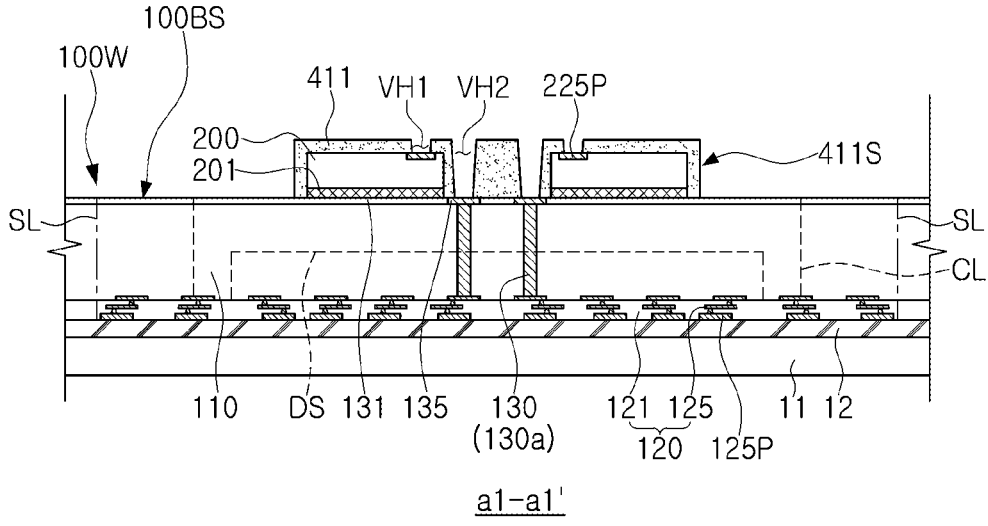
Figure 9B:
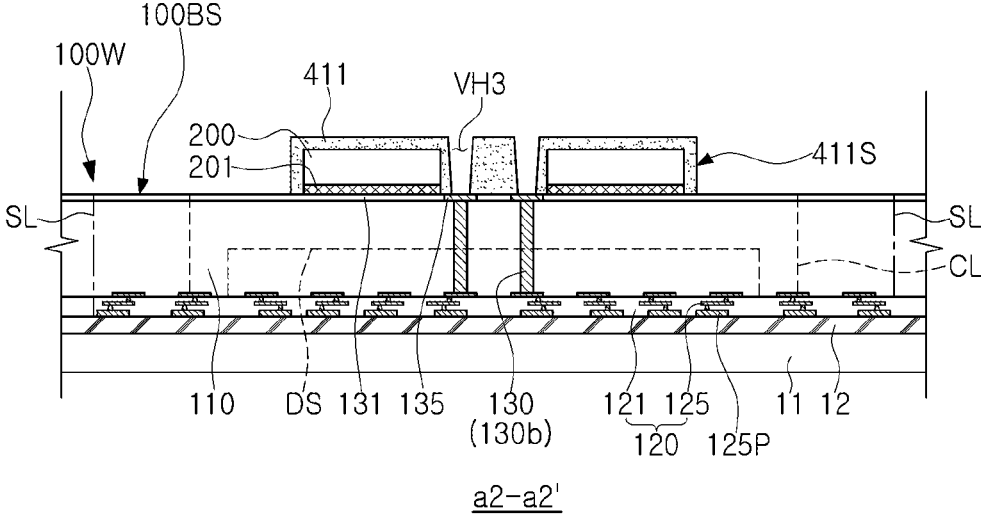

FIG. 9A illustrates a first cutting surface a1-a1' within area 'A' of FIG. 7A, and FIG. 9B illustrates a second cutting surface a2-a2' within area "A" of FIG. 7A.

Referring to FIGS. 9A and 9B, a first dielectric layer 411 may be formed on the rear surface 100BS of the semiconductor wafer 100W. The first dielectric layer 411 may be formed by patterning a photosensitive resin formed on or to cover the second semiconductor chip 200. The first dielectric layer 411 may be patterned to have a first via hole VH1, a second via hole VH2, a third via hole VH3, and a sidewall 411S. The first via hole VH1 may penetrate through the first dielectric layer 411 to expose at least a portion of the second connection pads 225P. The second via hole VH2 and the third via hole VH3 may penetrate through the first dielectric layer 411 to expose at least a portion of the back interconnection structure 135. The sidewall 411S of the first dielectric layer 411 may be formed to be positioned inside the reference line CL.

Figure 10A:
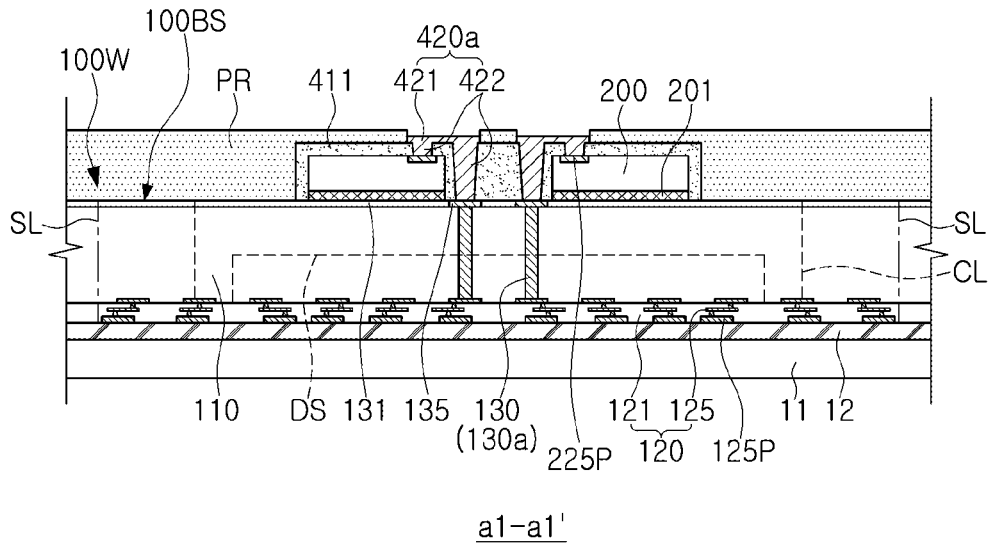
Figure 10B:
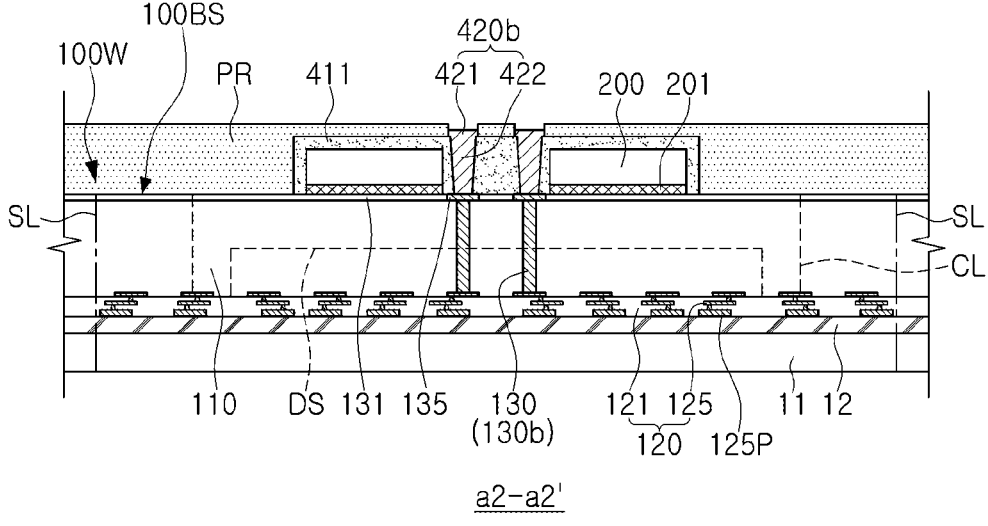

FIG. 10A illustrate a first cutting surface a1-a1' corresponding to FIG. 9A, and FIG. 10B illustrates a second cutting surface a2-a2' corresponding to FIG. 9B.

Referring to FIGS. 10A and 10B, first conductive structures 420a and second conductive structures 420b may be formed. The first conductive structures 420a and the second conductive structures 420b may be formed by forming a photoresist PR on or covering a first dielectric layer 411 and filling a patterning region of the photoresist PR with metal such as copper (Cu), or the like, using a plating process. Depending on the process, a polishing process may be performed to planarize the first conductive structures 420a and the second conductive structures 420b.

Figure 11A:
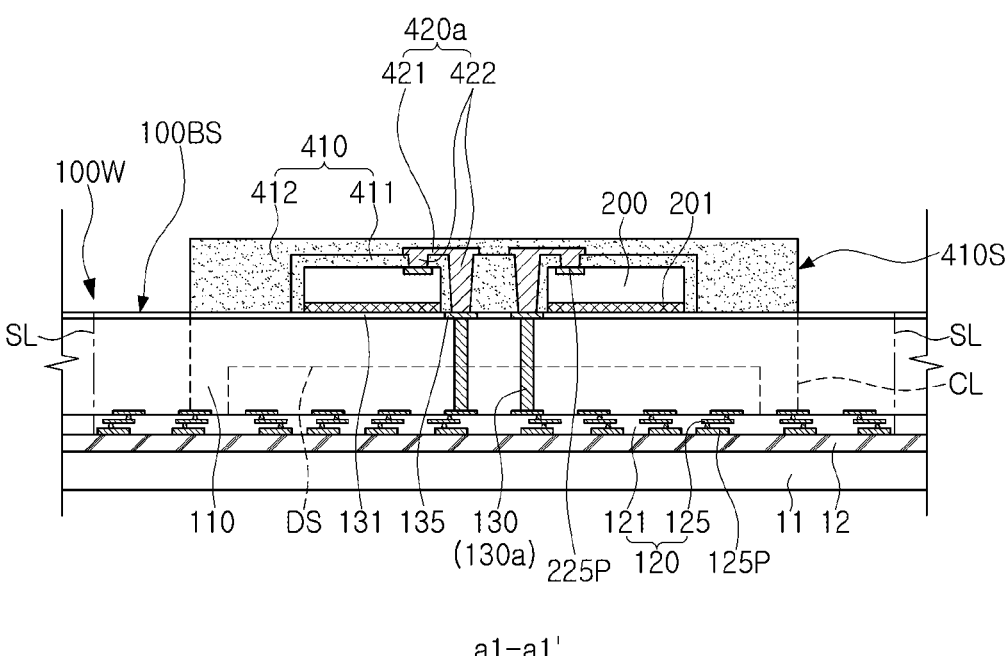
Figure 11B:
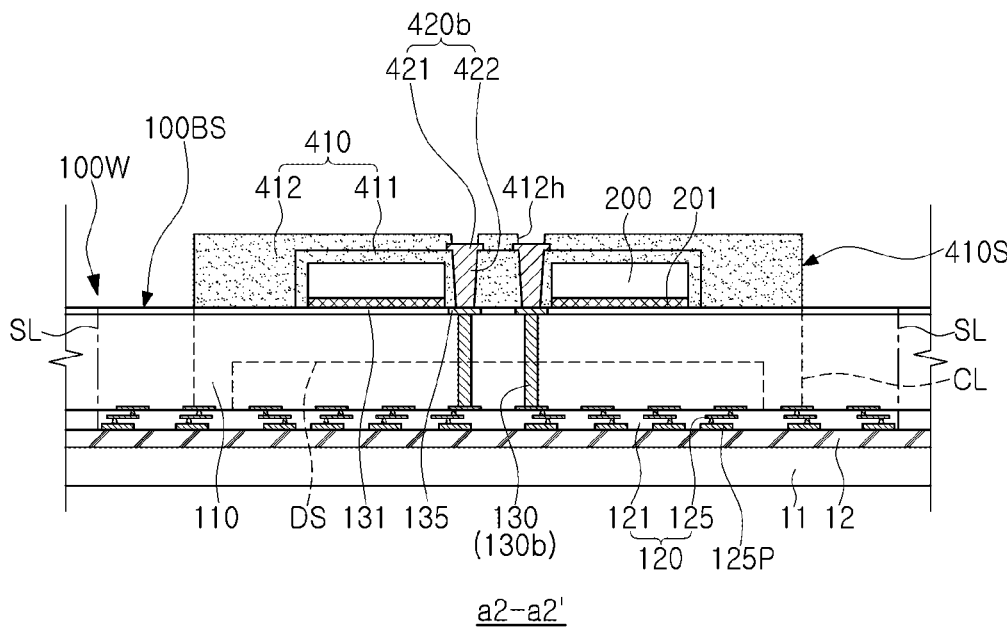

FIG. 11A illustrates a first cutting surface a1-a1' corresponding to FIG. 10A, and FIG. 11B illustrates a second cutting surface a2-a2' corresponding to FIG. 10B.

Referring to FIGS. 11A and 11B, a second dielectric layer 412 may be formed on a rear surface 100BS of the semiconductor wafer 100W. The second dielectric layer 412 may be formed by patterning a photosensitive resin formed on or to cover the first dielectric layer 411, the first conductive structures 420a, and the second conductive structures 420b.

The second dielectric layer 412 may be patterned to have an opening 412h and a side surface 410S of the dielectric layer 410. The opening 412h may penetrate through the second dielectric layer 412 to expose at least a portion of the second conductive structures 420b. The side surface 410S of the dielectric layer 410 may be formed to be positioned on the same line as a reference line CL or positioned inside the reference line CL. That is, the side surface 410S of the dielectric layer 410 may be formed to be spaced apart from a scribe lane SL by a predetermined distance.

Figure 12A:
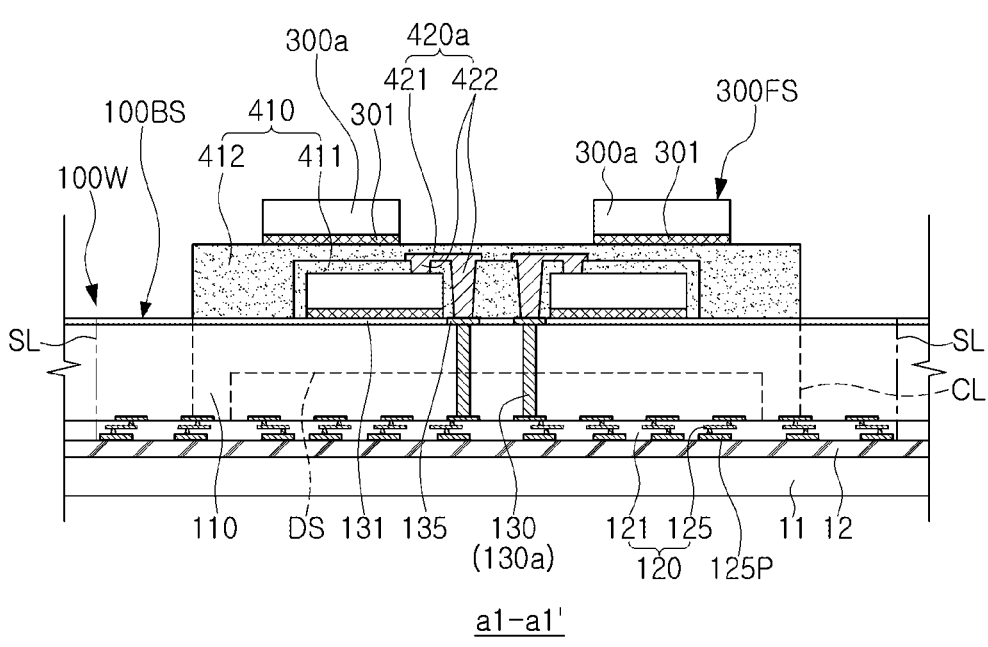
Figure 12B:
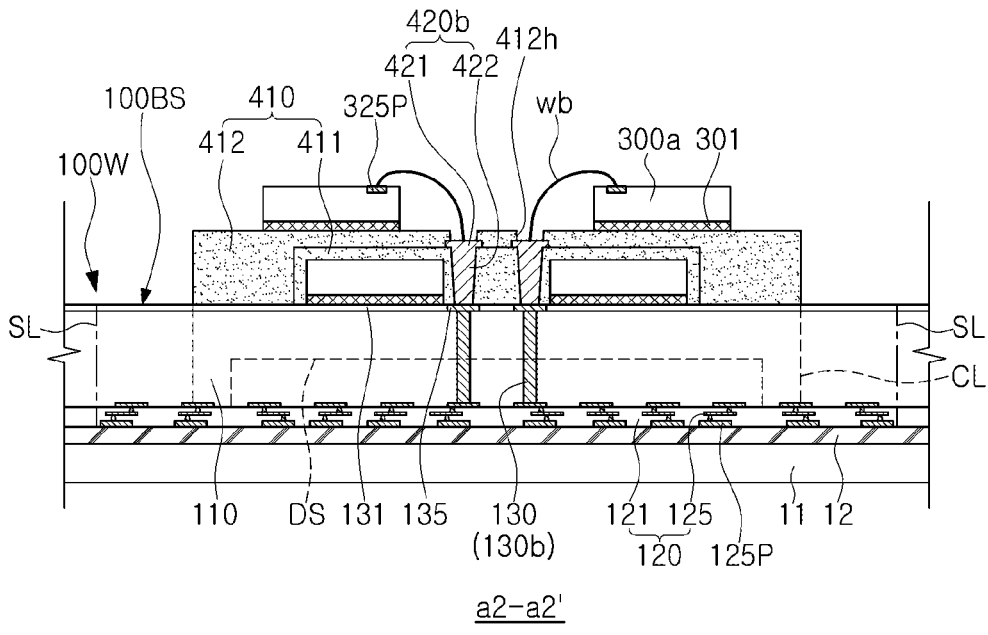

FIG. 12A illustrates a first cutting surface a1-a1' corresponding to FIG. 11A, and FIG. 12B illustrates a second cutting surface a2-a2' corresponding to FIG. 11B.

Referring to FIGS. 12A and 12B, a third lower semiconductor chip 300a may be on the dielectric layer 410. The third lower semiconductor chip 300a may be attached on the dielectric layer 410 by a second adhesive film 301 so that a third front surface 300FS faces upwardly. According to an example embodiment, at least one pair of third lower semiconductor chips 300a may be on both sides with the first conductive structures 420a and the second conductive structures 420b therebetween.

Thereafter, conductive wires wb connecting third connection pads 325P to the second conductive structures 420b may be formed. The conductive wires wb may include gold (Au), silver (Ag), lead (Pb), aluminum (Al), copper (Cu), or an alloy thereof, but an example embodiment thereof is not limited thereto.

Figure 13:
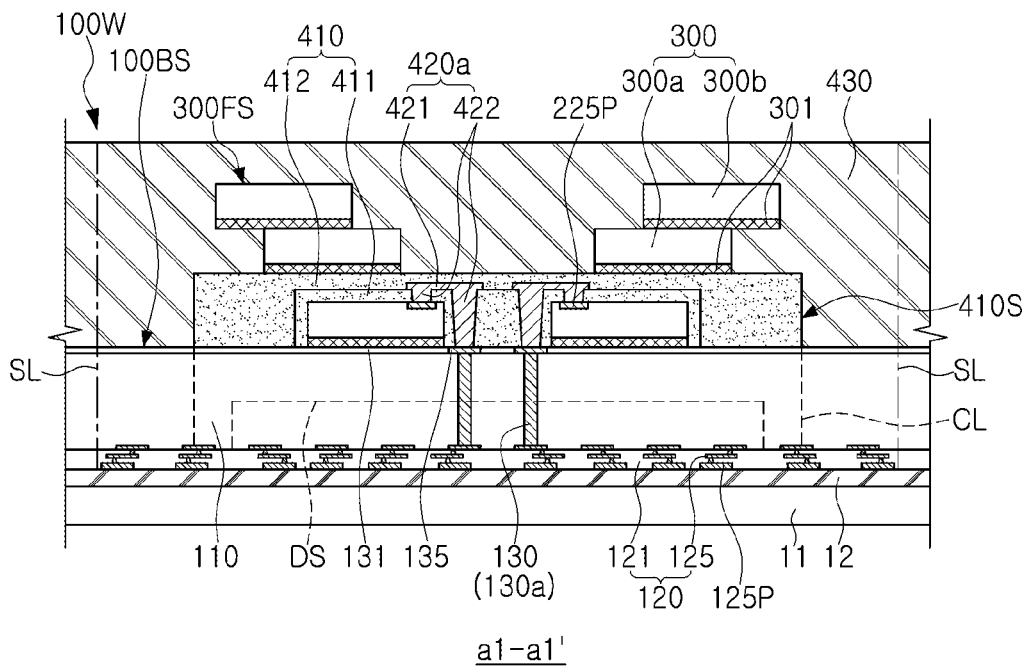

FIG. 13 illustrates a first cutting surface a1-a1' corresponding to FIG. 12A.

Referring to FIG. 13, after a third upper semiconductor chip 300b is positioned in a similar manner to the third lower semiconductor chip 300a, an encapsulation layer 430 may be formed on the semiconductor wafer 100W. The encapsulation layer 430 may be formed on or to completely cover the third semiconductor chip 300 and the side surface 410S of the dielectric layer 410. The encapsulation layer 430 may be formed by coating and curing an insulating resin such as EMC.

Figure 14:
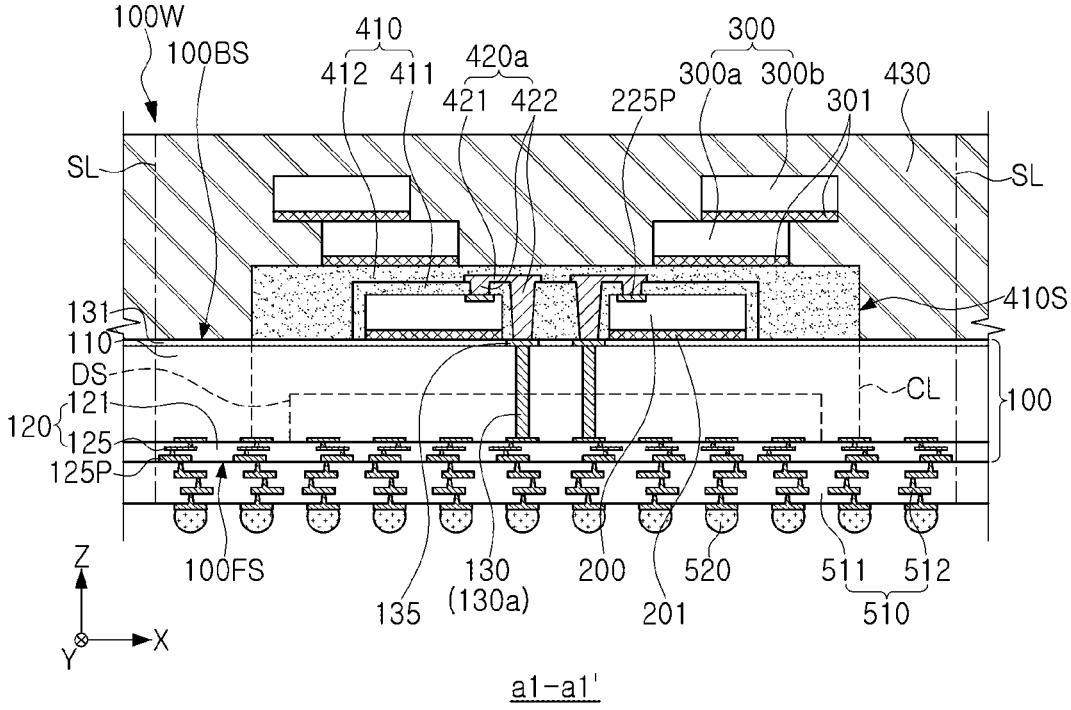

FIG. 14 illustrates a first cutting surface a1-a1' corresponding to FIG. 13.

Referring to FIG. 14, after removing a carrier substrate 11 and a bonding material layer 12, a redistribution structure 510 and connection bumps 520 may be formed on the front surface 100FS of the semiconductor wafer 100W. The redistribution structure 510 may include an insulating layer 511 and a redistribution layer 512. The insulating layer 511 may be formed by coating and curing a photosensitive resin such as PID. The redistribution layer 512 may be formed using a photolithography process, a visual process, a plating process, or the like.

As set forth above, according to example embodiments of the present inventive concept, by introducing conductive structures connecting through electrodes of a first semiconductor chip to connection pads of a second semiconductor chip, a semiconductor package having improved electrical characteristics and yield may be provided.

While example embodiments have been shown and described above, it will be apparent to those skilled in the art that modifications and variations could be made without departing from the scope of the present inventive concept as defined by the appended claims.

What is claimed is:
1. A semiconductor package, comprising:
    a first semiconductor chip having a first front surface and an opposite first rear surface, the first semiconductor chip including first connection pads on the first front surface and through electrodes extending to the first rear surface and electrically connecting at least a portion of the first connection pads;

a second semiconductor chip having a second front surface and an opposing second rear surface, including second connection pads on the second front surface and on the first rear surface so that the second rear surface faces the first semiconductor chip;

a dielectric layer on the second semiconductor chip and on the first rear surface;

first conductive structures in the dielectric layer connecting a first group of the through electrodes and the second connection pads;

second conductive structures in the dielectric layer having first and second ends, the first ends connecting a second group of the through electrodes, and at least a portion of the second ends being exposed from the dielectric layer;

at least one third semiconductor chip having a third front surface and an opposing third rear surface, the at least one third semiconductor chip including third connection pads on the third front surface and on the dielectric layer so that the third rear surface faces the second semiconductor chip;

conductive wires connecting the second conductive structures and the third connection pads;

an encapsulation layer on the dielectric layer and the at least one third semiconductor chip on the first rear surface; and connection bumps on the first front surface electrically connected to the first connection pads.

2. The semiconductor package of claim 1, wherein the first and second conductive structures comprise a pattern portion extending in parallel in the dielectric layer, respectively, and a via portion extending perpendicularly from the pattern portion, and electrically connected to the second connection pads or the through electrodes.

3. The semiconductor package of claim 2, wherein the via portion has a width that is greater than a width of the through electrodes.

4. The semiconductor package of claim 1, wherein the dielectric layer has openings exposing at least a portion of other ends of the second conductive structures.

5. The semiconductor package of claim 4, wherein the conductive wires are connected to the second conductive structures through the openings.

6. The semiconductor package of claim 1, wherein the at least one third semiconductor chip does not overlap the first conductive structures and the second conductive structures in a direction perpendicular to the first rear surface.

7. The semiconductor package of claim 1, wherein the dielectric layer has a width that is narrower than a width of the first semiconductor chip.

8. The semiconductor package of claim 1, wherein the encapsulation layer is on a side surface of the dielectric layer.

9. The semiconductor package of claim 1, wherein the dielectric layer comprises a material that is different from that of the encapsulation layer.

10. The semiconductor package of claim 9, wherein the dielectric layer comprises a photosensitive resin, and the encapsulation layer comprises a non-photosensitive resin.

11. The semiconductor package of claim 1, wherein the first semiconductor chip comprises a logic chip, and the second semiconductor chip and the at least one third semiconductor chip comprise a memory chip.

12. The semiconductor package of claim 1, further comprising:

adhesive films on the second rear surface and the third rear surface, respectively.

13. The semiconductor package of claim 1, wherein the first semiconductor chip further comprises back pads on the first rear surface, and the through electrodes electrically connect the back pads and the at least a portion of the first connection pads.

14. The semiconductor package of claim 1, further comprising:

a redistribution structure including an insulating layer on the first front surface, and a redistribution layer electrically connecting the first connection pads and the connection bumps in the insulating layer.

15. A semiconductor package, comprising:

a first semiconductor chip having a first front surface and an opposing first rear surface, the first semiconductor chip including first connection pads on the first front surface and through electrodes spaced apart in a first direction, parallel to the first rear surface, and electrically connected to at least a portion of the first connection pads;

at least one pair of second semiconductor chips spaced apart from each other in a second direction intersecting the first direction on the first rear surface of the first semiconductor chip, and including second connection pads;

first and second conductive structures electrically connected to the through electrodes between the at least one pair of second semiconductor chips;

a dielectric layer on at least a portion of at least some of the second semiconductor chips, the first conductive structures, and the second conductive structures; and at least one pair of third semiconductor chips spaced apart from each other in the second direction on the dielectric layer, and including third connection pads;

wherein the first conductive structures extend in the dielectric layer to connect a first group of the through electrodes and the second connection pads, and the second conductive structures connect a second group of the through electrodes and a conductive wire connected to the third connection pads.

16. The semiconductor package of claim 15, wherein the at least one pair of third semiconductor chips do not overlap the first and second conductive structures in a direction, perpendicular to the first rear surface.

17. The semiconductor package of claim 15, wherein a first separation distance between the at least one pair of second semiconductor chips is smaller than a second separation distance between the at least one pair of third semiconductor chips.

18. The semiconductor package of claim 15, wherein the first conductive structure comprises a pattern portion extending in the second direction, and a via portion extending from the pattern portion perpendicularly to the first rear surface and electrically connected to the second connection pads or the through electrodes.

19. A semiconductor package, comprising:

a first semiconductor chip having a first front surface and an opposing first rear surface, the first semiconductor chip including first connection pads on the first front surface, and through electrodes extending perpendicularly to the first rear surface and electrically connected to at least a portion of the first connection pads;

a second semiconductor chip having a second front surface and an opposing second rear surface, the second semiconductor chip including second connection pads on the second front surface and on the first rear surface so that the second rear surface faces the first semiconductor chip;

conductive structures including a pattern portion extending in parallel to the first rear surface on the second semiconductor chip, and a via portion extending from the pattern portion and connected to the second connection pads or the through electrodes;

a dielectric layer on the first rear surface of the first semiconductor chip, the second semiconductor chip, and the conductive structures; and an encapsulation layer on the first rear surface of the first semiconductor chip and a side surface of the dielectric layer.

20. The semiconductor package of claim 19, wherein the dielectric layer comprises a first dielectric layer on the second front surface and the side surface of the second semiconductor chip, and a second dielectric layer on the first dielectric layer, and the pattern portion of the conductive structures is between the first dielectric layer and the second dielectric layer, and the via portion penetrates through the first dielectric layer.

* * * * *